Nov. 30, 1965 L. P. ZIMMERMAN ET AL 3,220,444

TRANSISTOR LEAD STRAIGHTENING APPARATUS

Filed Oct. 14, 1963 7 Sheets-Sheet 1

INVENTORS
LOUIS P. ZIMMERMAN
ALBERT W. ZEMEK

BY Fidelman & Wolffe

ATTORNEY

TRANSISTOR LEAD STRAIGHTENING APPARATUS

INVENTORS
LOUIS P. ZIMMERMAN
ALBERT W. ZEMEK

BY Fidelman & Wolffe

ATTORNEY

TRANSISTOR LEAD STRAIGHTENING APPARATUS

Filed Oct. 14, 1963 7 Sheets-Sheet 3

INVENTORS
LOUIS P. ZIMMERMAN
ALBERT W. ZEMEK

BY Fidelman and Wolffe
ATTORNEY

TRANSISTOR LEAD STRAIGHTENING APPARATUS

Filed Oct. 14, 1963 7 Sheets-Sheet 4

INVENTORS
LOUIS P. ZIMMERMAN
ALBERT W. ZEMEK
BY Fidelman and Wolffe
ATTORNEY

TRANSISTOR LEAD STRAIGHTENING APPARATUS

Filed Oct. 14, 1963 7 Sheets-Sheet 5

INVENTORS
LOUIS P. ZIMMERMAN
ALBERT W. ZEMEK

BY Fidelman and Wolffe
ATTORNEY

Nov. 30, 1965 L. P. ZIMMERMAN ETAL 3,220,444

TRANSISTOR LEAD STRAIGHTENING APPARATUS

Filed Oct. 14, 1963 7 Sheets-Sheet 6

INVENTORS
LOUIS P. ZIMMERMAN
ALBERT W. ZEMEK

Fidelman & Wolffe

ATTORNEY

TRANSISTOR LEAD STRAIGHTENING APPARATUS

Filed Oct. 14, 1963 7 Sheets-Sheet 7

INVENTORS
LOUIS P. ZIMMERMAN
ALBERT W. ZEMEK
BY Fidelman and Wolffe
ATTORNEY

United States Patent Office 3,220,444
Patented Nov. 30, 1965

3,220,444
TRANSISTOR LEAD STRAIGHTENING APPARATUS

Louis P. Zimmerman and Albert W. Zemek, Binghamton, N.Y., assignors to Universal Instruments Corporation, Binghamton, N.Y., a corporation of New York Filed Oct. 14, 1963, Ser. No. 316,084
13 Claims. (Cl. 140—147)

This application is a continuation-in-part of application, Serial No. 157,432, filed December 6, 1961, and issued as Patent No. 3,122,179.

The present invention relates to apparatus for handling transistors, or similar electrical components having leads extending from the bodies thereof, and more particularly to apparatus for straightening the leads after they have been combed.

Apparatus heretofore developed for the handling of mass produced lead bearing electrical components has generally been in the field of electric lamps and vacuum tubes and is suited to a component having stiff, non-bendable leads or socket contacts. Generally, the known apparatus is either partially hand operated, making it necessarily unadaptable to mass production, or it is specifically adapted to the particular items noted. In either case, the known apparatus is unsuitable to rapid and automatic production of printed circuit boards, wherein the leads of a transistor arranged in more than one plane, must be perfectly straight for use in automatic transistor inserters as shown in the Mueller Patent 3,025,593, issued March 20, 1962. Since insertion machines of this type are often used in long assembly lines where a printed circuit board may travel through a large number of the insertion stations, it is advisable to fully straighten the leads before feeding the transistor to the insertion machine. One bent lead can cause the rejection of an entire circuit board, at the end of the line.

The Jankowski Patent 3,075,562 issued January 29, 1963, illustrates a means for attempting to solve this problem by combing the leads automatically before transporting the transistor to the insertion station. However, Jankowski only partially solves the problem. Combing as shown in Patent 3,075,562 will take out some kinks and straighten the leads but will not prevent spring-back of the leads after removal from the combs and thereafter malfunction of the inserter. To prevent spring-back, it is necessary to perform another operation, such as a hammering to insure a continuing straightness. In applicants' copending application Ser. No. 157,432 filed December 6, 1961, issued as Patent 3,122,179, a machine having combined the advantages of a combing and hammering action to permanently straighten the leads of a transistor prior to insertion is described. In Patent 3,122,179, the hammering means is quite complex and although functioning satisfactorily, does require a complicated guide means in front of the hammer to insure proper placement of the leads in the hammer device.

Therefore it is an object of the present invention to provide an apparatus to enable the rapid and automatic hammering of transistor leads subsequent to lead combing.

Another object of the present invention is to provide an apparatus for the insertion of the combed leads of a transistor into a lead hammer device which permanently straighten said leads.

Yet another object of the present invention is to provide a lead hammer equipped with retractable means for guiding leads of a transistor to a position completely within the lead hammer.

A further object of the present invention is to provide timing means for controlling an electrical circuit for actuating an inserting and combing device in conjunction with a hammering device.

A still further object of the present invention is to provide lead guides within a hammering means for guiding the leads of a transistor being inserted into the hammering means and which can be retracted from the hammer before a hammering stroke upon the leads.

Another object of the present invention is to provide an apparatus capable of realizing the above objects and which will be reliable and dependable in operation and which does not require a complicated guide means on the face of the straightening means.

Other objects and many of the attendant advantages of the present invention will be apparent from the following description and drawings, wherein.

Figure 1:
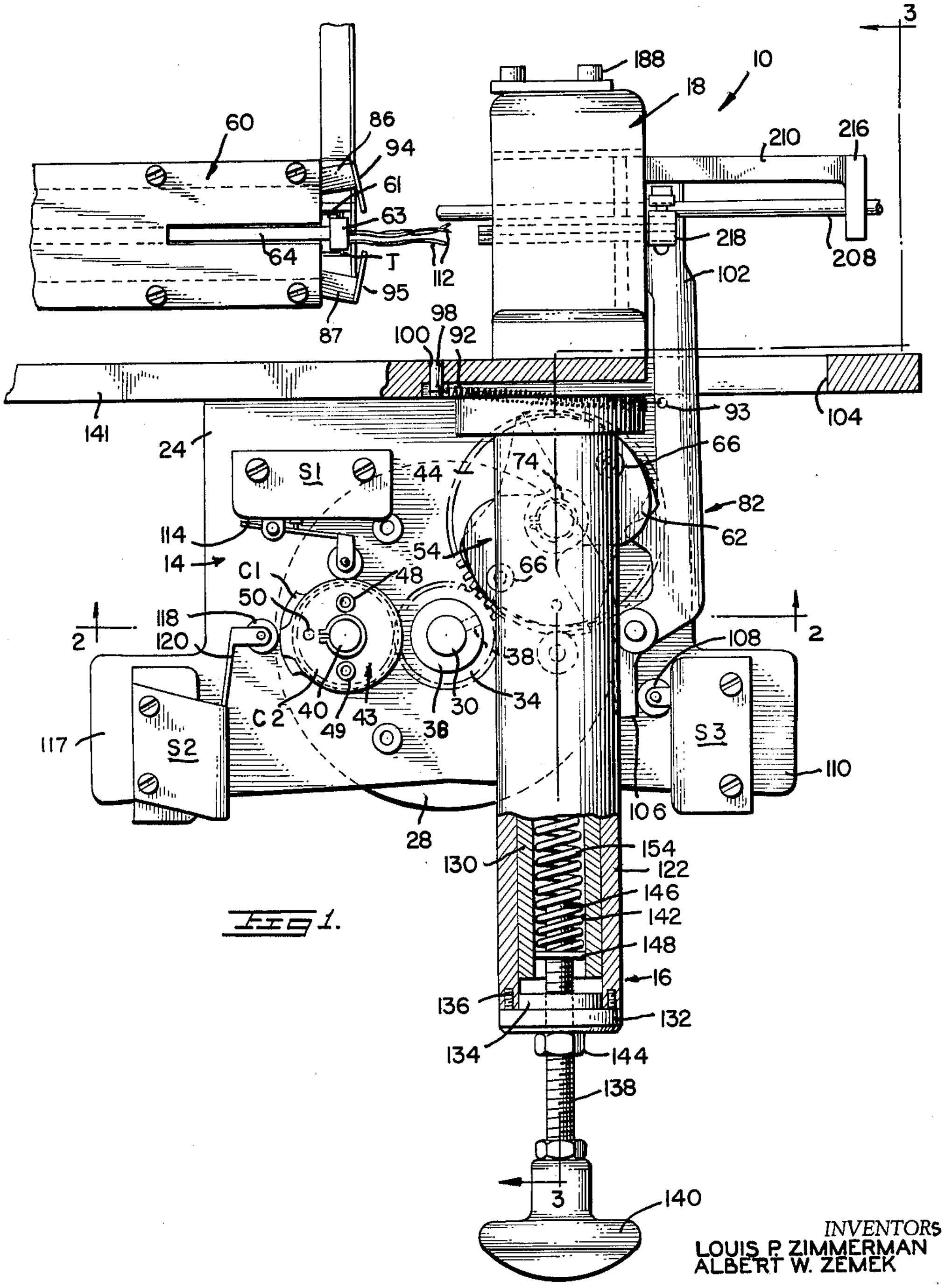
FIG. 1 is an elevational view of a transistor hammering device partially broken away, and an adjacent portion of a transistor inserting and combing device.
Figure 2:
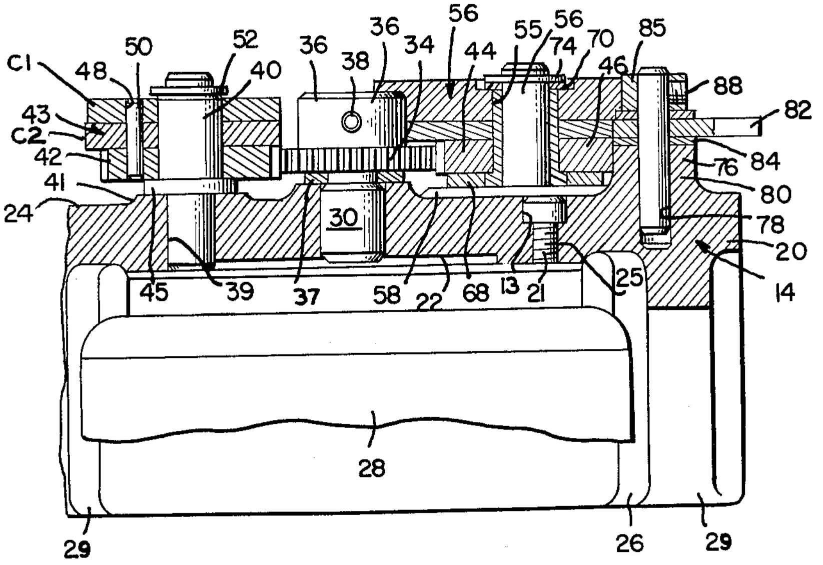
FIG. 2 is a cross-sectional view of the transistor hammering device, showing particularly the assembly of the operation controlling cams and the relationships of the journalling shafts taken along a staggered line 2—2 of FIG. 1 cutting each of the cam assemblies.
Figure 3:
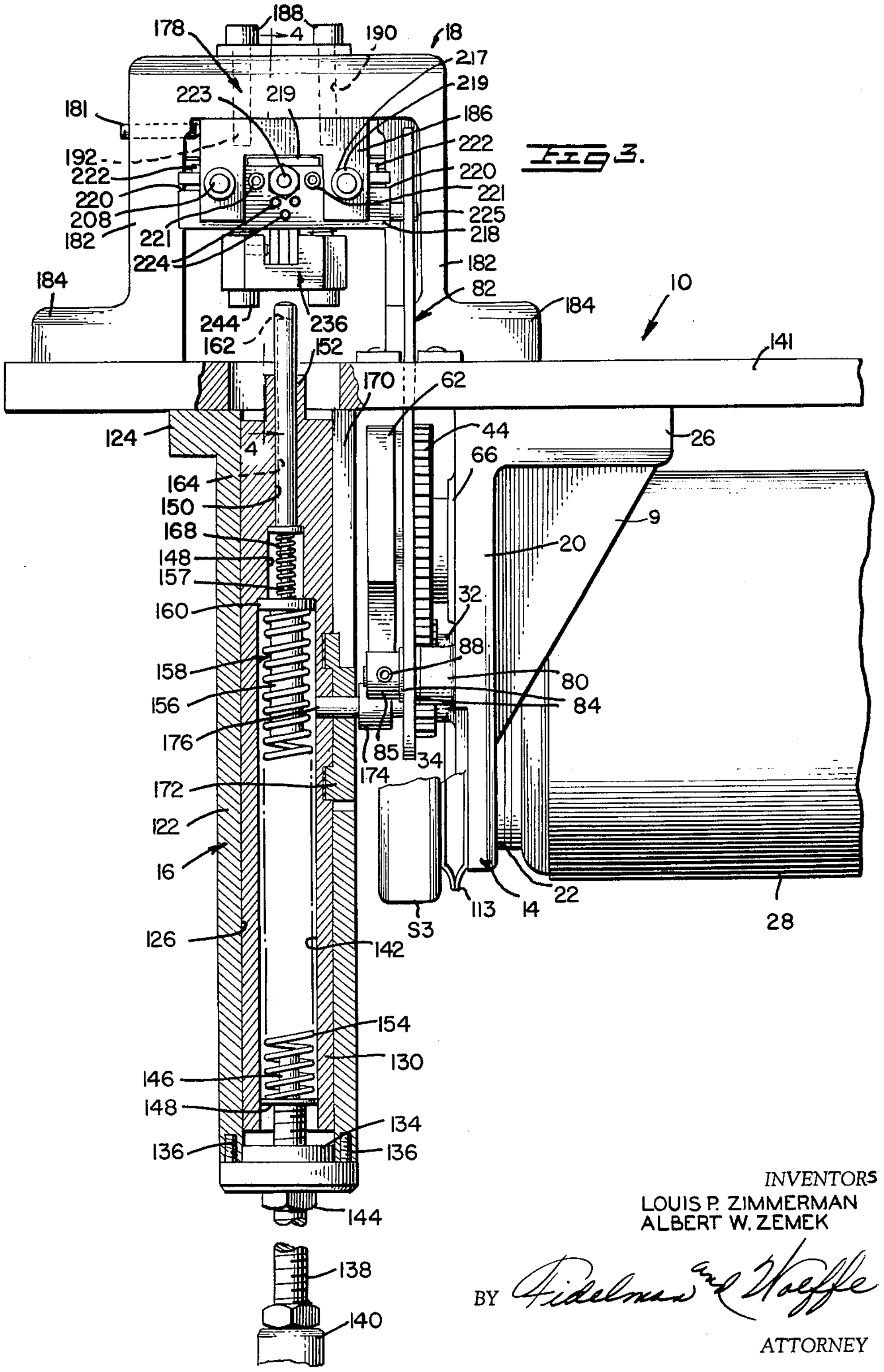
FIG. 3 is a cross-sectional view of the hammer mechanism taken along lines 3—3 of FIG. 1.

Referring specifically to FIGS. 1–3, the transistor lead straightener, generally designated 10, mounted on a base member 141, straightens the leads 112 of a transistor T carried in a nest 61 on the near end of a feed bolt 65 (FIGS. 10–12) which is reciprocatable in an adjacently mounted transistor inserter and lead comber, generally designated 60. The transistor inserter and lead comber 60 is fully described Patent 3,122,179, where it is illustrated in conjunction with another lead straightener design. The elements of the inserter and comber 60, also shown in the present application have the same numerical designation as in Patent 3,122,179 in order to help provide a clearer understanding of the cooperating mechanisms.

The transistor straightener 10 comprises; a main mounting section, generally designated 14, and a hammer housing, generally designated 16, both mounted on the lower surface of the base 141, and a die section, generally designated 18, mounted on the upper surface of the base member 141. The main mounting section 14 (FIG. 2) comprises, in part, a vertical mounting plate 20 with generally planar faces 22 and 24 and a horizontal mounting foot 26 extending at right angles from the upper edge of the mounting plate 20 for attaching the mounting section 14 to the base 141. A pair of strengthening webs 9 extend between the plate 20 and the foot 26 at either end thereof. A rotary electric motor 28 is mounted on face 22 between the pair of webs 9 by bolts 21 extending through holes 25 in plate 20 with their heads recessed in coaxial countersunk portions 13. A rotating drive shaft 30 of the motor 28 extends through the plate 20 and a coaxial cylindrical boss 32 on face 24. Keyed on the rotary shaft 30, adjacent the face of the cylindrical boss 32, is a drive gear 34 held against axial movement on the drive shaft 30 by a stop 36 fixed to shaft 30 by a roll pin 38. An anti-friction thrust bearing 37 is mounted on drive shaft 30 between the drive gear 34 and the face of the boss 32.

A first stub shaft 40, press fit into a hole 39 through a coaxial cylindrical boss 41 on the face 24 of the plate 20, parallel to drive shaft 30, rotatably journals a first composite drive member generally designated 43. An anti-friction thrust bearing 45 is mounted on the first stub shaft 40 between the composite driven member 43 and the face of the cylindrical boss 41 while a snap ring 52 in an encircling groove (not shown) cut in the first stub shaft 40 outward of the first composite driven member 43, restricts the axial movement of said driven member 44 on the first stub shaft 40.

The first composite driven member 43 comprises a driven gear 42 journalled on the first stub shaft 40 adjacent the thrust bearing 45 and meshing with drive gear 34. A pair of stacked cams $C_1$ and $C_2$ are journalled on the first stub shaft 40 outwardly of the driven gear 42 and are fixed thereto by a pair of diametrically opposed screws 48, each extending through coaxial holes in cams $C_1$ and $C_2$ and into a coaxial threaded hole in the driven gear 42. A composite timing hole 49 extending through the stacked cams $C_1$ and $C_2$ and the driven gear 42, has a timing pin 50 force fitted therein.

A second composite driven member 54 is rigidly fixed on a hollow cylindrical bearing 55 journalled on a second stub shaft 56, force fitted in a passage (not shown) in the plate face 24 and extends outward of a coaxial cylindrical boss 58 parallel to the drive shaft 30. The second composite driven member 54 comprises; a second driven gear 44 fixed on the bearing 55 on the second driven shaft 56 and meshing with drive gear 34, and a pair of stacked cams 62 and 46 also fixed on the bearing 55 and rigidly fixed to the second driven gear 44 by a pair of diametrically opposed screws 66 each extending through aligned holes in the cams 62 and 46 and threaded into a coaxial hole in the second driven gear 44. A timing pin 68 is force fitted in a composite hole through the cams 62 and 46 and the second driven gear 44. A thrust washer 68 is mounted coaxially around the second stub shaft 56, encircling the lower end of the bearing 55, and extending between the face of the cylindrical boss 58 and the second driven gear 44. A second thrust washer 70 is journalled on the outer end of the second stub shaft 56, within a countersink 72 in the upper face of the upper cam 62 of the stacked cams 62, 46. A snap ring 74 is fixed in a groove in the second stub shaft 56 outwardly of the second thrust washer 70 axially restraining the second composite member 54.

A third stub shaft 76 is press fit into a hole 78 in the face 24 of the plate 20 and extends outwardly through a coaxial cylindrical boss 80 parallel to the drive shaft 30. A tube retracting lever, generally designated 82, is pivoted on the third stub shaft 76 between thrust washers 84 and held in axial alignment on the third stub shaft 76 by a stop element 85 fixed to the outer end of the third stub shaft 76 by a roll pin 88. The lever 82 has a cam follower to be 90 biased against the periphery of tube retracting cam 46 (one of the stacked cams 62, 46 of the second composite member 54) by a tension spring 92 connected to the lever 82 through hole 93 and extending through a groove 96 in the base 141 to be anchored on a vertical pin 98 fitted into a hole 100 in the upper face of the groove 96. The upper end 102 of the lever 82 (above the pivot pin 76) extends through a long, narrow slot 104 to the base member 141 for a purpose to be discussed later. The lower end 106 of the lever 82 presses against a roller 108 mounted on an outwardly biased switch contact (not shown) of a safety switch $S_3$ fixed on the face 24 of a first extension 110 of the plate 20 by a shock mounting 113.

A switch $S_1$ is fixed to the face 24 of the plate 20 by a shock absorbing mounting (not shown) between the first composite member 43 and the base member 141, with a switch arm 114 biased outwardly with a roller follower 116 at the outer end of switch arm 114 riding on the peripheral contour of cam $C_1$. A switch $S_2$ is mounted on a second extension 117 of the plate 20 by a shock absorbing mounting (not shown) with a roller 118, on the outer end of a contact arm 120, biased against the peripheral contour of the cam $C_2$. The purposes of switches $S_1$ and $S_2$ will be later discussed during a discussion of the electrical circuitry.

The hammer housing 16 comprises, in part, an elongated open ended hollow cylinder 122 having a narrow radial flange 124 at one end thereof, and a coaxial bore 126 extending its entire length. The cylinder 122 is vertically mounted beneath the base 141 by a series of screws (not shown) extending through the base 141 and threaded into tapped holes in the flange 124, abutting its lower face. The cylinder 122 is mounted adjacent the outer end of the second stub shaft 56 with the axis of the second stub shaft 56 intersecting the axis of the cylinder 122. A circular passage 128, through the base 141, is coaxial with the bore 126 of the cylinder 122 and has a diameter at least as large.

The lower end of the cylinder 122 is closed by a circular plate 132 extending across its face and having a circular boss 134 extending snugly into the bore 126. A series of bolts 136 extend from the lower face of the circular plate 132 into tapped holes in the faces of the wall of the cylinder 122.

An adjusting bolt 138, having a hand grip 140, is threaded through a tapped coaxial aperture (not shown) in the circular plate 132 and extends up into bore 126 in the cylinder 122. Threaded on the adjusting bolt 138, adjacent the lower face of the circular plate 132, is a nut 144 used to lock the bolt 138 in an adjusted position. A cylindrical piston 130, having a coaxial main bore 142 extending through its lower face, fits within the bore 126 of the cylinder 122 and extends the length thereof. The upper end of the bolt 138 lying within the main bore 142 of the cylindrical piston 130, is necked down to form a coaxial cylindrical rod 146. Mounted on the rod 146 adjacent the threaded section of the bolt 138 is a washer 148 snugly fitting in the main bore 142. The main bore 142 is directly connected with a smaller diameter coaxial auxiliary bore 148 in the upper end of the piston 130, but not extending to the upper face thereof. A central passage 150 of still smaller diameter connects the upper end of the auxiliary bore 148 with the upper face of the piston 130 where it extends through a coaxial necked down portion 152 of the piston 130. A main coil spring 154 is compressed in the main bore 142 of the piston 130, at its lower end, extending over the rod portion 146 of the adjusting bolt 138, and abutting the upper face of the washer 148. At the upper end of the main bore 142 the main coil spring 154 extends over a large diameter section 156 of a locating post, generally designated 158, abutting an integral flange 160 biased against the top end of the main bore 142. An upper necked down coaxial section 157 of the post 158 extends from the flange 160 up through the auxiliary bore 148 and into the central passage 150. A hammer rod 162 is slidably mounted in the central passage 150, loosely carrying the upper end of the necked down portion of locating post 158 in an axial passage 164. The upward movement of the hammer rod 162 is limited by an integral flange 166 on its lower end which is slidable in the auxiliary bore 148 and abuts the upper end thereof. A narrow, light coil spring 168 is mounted over the necked down section 157 of the locating post 158 in the auxiliary bore 148 and is compressed between flanges 166 of the hammer rod 162 and the flange 160 of the rod 158 to comprise a yieldable, upwardly biased hammer.

A vertical slot 170, completely through the wall of the cylinder 122, extends from the upper end of the cylinder 122 to a point at least half way down and intersects the axis of the second stub shaft 56. A vertical key 172 is fixed in the outer wall of the piston 130 and extends into the slot 170 of the cylinder 122 to prevent radial movement of the piston 130 as it reciprocates. A cam following roller 174 is journalled on one end of a stub axle 176 fitted at its other end into a radial passage through the key 172 and the wall of the piston 130. The roller 174 lies in the plane of, and rides against, the peripheral contour of the hammer cam 62 of the composite driven member 54 to force the piston 130 downward against the upwardly biasing action of the main spring 154.

Figure 4:
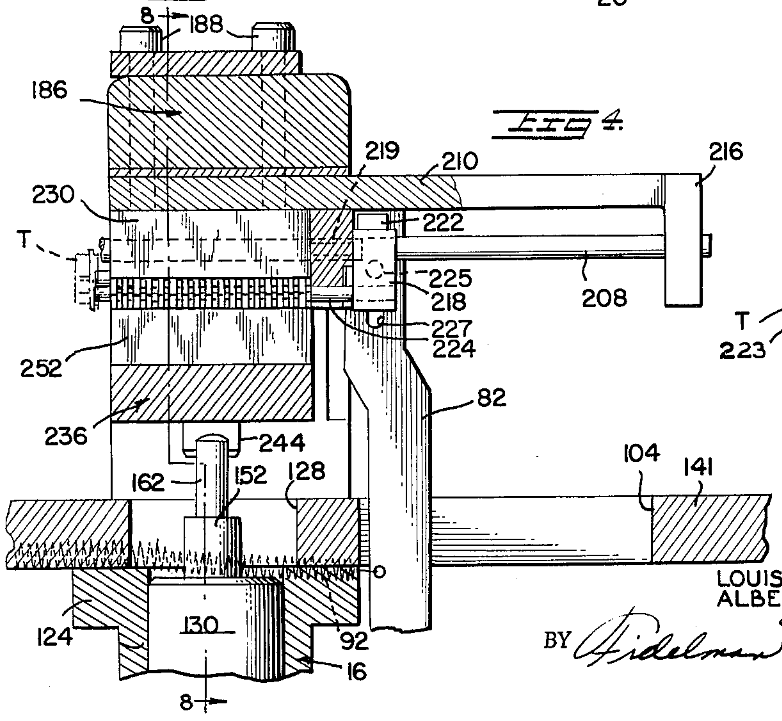
FIG. 4 is a sectional view of the die housing of the present invention taken along line 4—4 of FIG. 3.

The die section 18 (FIGS. 3, 4, 8, and 9) is fixed to the upper face of the base on member 141, centered over the hammer housing 16 and comprises in part a U-shaped die housing, generally designated 178, having a central upper bight 180 and a pair of downwardly extending parallel legs 182. Each leg 182 has an outwardly extending horizontal foot 184 for connecting the housing 178 to the upper face of the base 141. A top die block 186 (FIGS. 1, 3 and 4) is bolted to the under side of the bight between the housing legs 182, by four bolts 188 extending through vertical holes 190 in the bight and threaded into coaxial holes 192 in the top die block 186. The main body portion 194 (FIGS. 8 and 9) of the die block 186 extends the length and breadth of the interior of the die housing 178, suspended from the upper portion of the cavity formed by the legs 182 and the bight 180 while an extension 210 extends horizontally from the side of the housing opposite the inserter and lead chamber 60. The extension 210 has a downwardly extending vertical flange 126 at its end. The body portion 194 has a pair of generally rectangular cut outs, generally designated 196, extending the length of the body section adjacent the legs 182. The cut outs are defined by vertical walls 198 upper horizontal walls 200, and the lower surface 204 of the top die block 186, the upper horizontal walls 200 being in the same plane and substantially between the upper surface 202 of the top die block 186 to form an upper flange 179. A set screw 181 extends through one of the legs 182 and abuts the flange 179 to hold it tightly in place. A semicircular groove 206 is formed in the middle of each vertical wall 198 to provide clearance for a pair of parallel guide rods 208 slidably carried in a pair of bushings 212 fitted in a pair of parallel horizontal holes 214. The flange 216 of the extension 210 has a pair of circular passages 217 with bushings 219 for slidably carrying the far ends of the guide rods 208.

Figure 6:
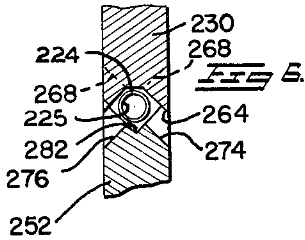
FIG. 6 is a partial cross-sectional view of a pair of opposing dies with an insertion tube extending therethrough.
Figure 13:
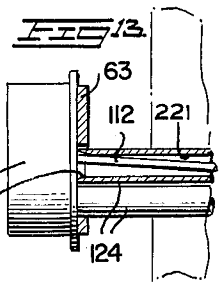
FIG. 13 is a partial sectional view of a transistor being inserted into the insertion tubes within the hammering dies; and, FIG. 14 is a schematic diagram of the electrical circuitry and the associated mechanical controlling elements of the instant invention.

A rectangular tie block 218 is mounted on the guide rods 208 between the main body portion 194 and the vertical flanges 216 of the top die block 186. The guide rods 208 are held in circular grooves (not shown) at the inner ends of slots 220 (FIG. 3) extending from the outer ends of the tie block 218. A bolt 222 in each end of the tie block 218 extends across one of the slots to clamp the guide rods tightly in the tie block 218. Three insertion tubes 224 are horizontally mounted in holes in the central portion of the tie block 218 in a pattern corresponding to that of the lead wires 112 of a three lead transistor T. Each insertion tube 224 has a coaxial passage 221 (FIGS. 6 and 13) extending the length thereof with one end of the tube 224 having an interior bevel 222 between the passage 225 and the end of the tube. A Delrin guide block 219 is centrally mounted on the inner side of the tie block 218 by a pair of roll pins 221 and a bolt 223 extending through the tie block 218 and the guide block 219. The insertion tubes 224 extend through coaxial insertion tube passages in the guide block 219. In the innermost position of the tie block 218 (FIG. 4) the guide block 219 fits snugly into one end of a central rectangular groove 226 in the top die block, extending from the lower face thereof to approximately the lower faces of the flanges 179. The insertion tubes 224 extend through the lower end of the central rectangular groove 226 with the beveled end remote from the tie block 218. A pin 225 extends from one side of the tie block 218 and passes through an elongated slot 227 in the upper end of the lever 82 so that pivoting of the lever 82 will reciprocate the tie block 218. A pair of outside upper dies 228 and a central upper die 230 are mounted in the central groove 228 extending from the inner position of the Delrin block 219 to the far end of the groove with the lower formed faces of the dies 228 and 230 not quite touching the insertion tubes 224. The upper dies 228 and 230 are held in place by a set screw 232, threaded into a passage 234 extending from the face 198 of one of the cut outs 196 to the side of the central groove 226. A rectangular bottom die block 236 is reciprocatably suspended beneath the top die block 186 on the smooth shanks 237 of a pair of bolts 238 loosely fitted into vertical guide holes 240 at either side of the lower die block 236. The upper ends of the shanks 237 of the bolts 238 are slidably received in guide passages 242 in the lower face of the upper die block 186 between the central slot 226 and the cut outs 196. The uppermost threaded end 239 of each of the bolts 238 is received in a threaded coaxial hole 241 in the extreme upper end of the upper guide passages 242. The upper end of the shank 237 of each of the bolts 238 abuts the upper end of the passage 242 leaving a space on the shanks 237 between the upper and lower die blocks 186 and 236 respectively, when the lower die block 236 rests in its lowest position abutting heads 244 of the bolts 238. A coil spring 246 encircles on each bolt shank 237 between the die blocks 186 and 236 and each spring 246 extends into countersinks 248 in the abutting faces of the blocks 186 and 236.

A pair of outside lower dies 250 and a lower central die 252 are stacked in a central slot 254 in the upper face of the lower die block 236 directly below the upper dies 228 and 230 respectively. The lower dies 250 and 252 are held firmly in place by a set screw 256 threaded into an horizontal tapped hole 258 extending from one side of the lower die block 236 into a side wall of the central slot 254 to abut against the adjacent lower die 250. The central upper die 230 is longer than its companion outside upper die 228 while the central lower die 252 is correspondingly shorter than its companion outside lower dies 250 permitting the insertion tubes 224 to extend through the composite in a triangular arrangement.

Figure 5:
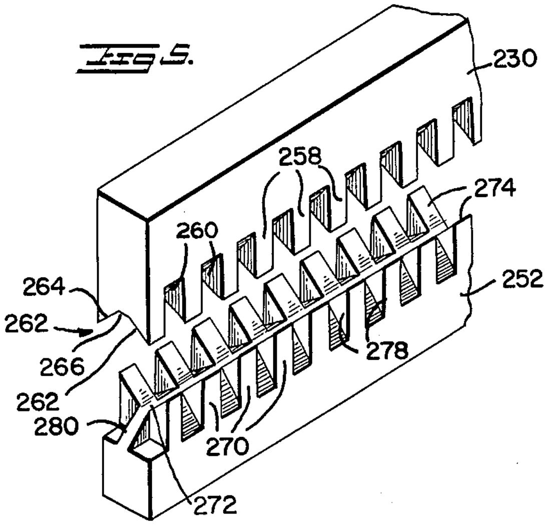
FIG. 5 is a perspective view of a pair of the opposing lead straightening dies of the instant invention.

In describing the configurations of the individual die blocks, only the central upper and lower dies 230 and 252, respectively, will be referred to (FIGS. 5–7) since they differ from the upper and lower outside dies 228 and 250, respectively, only in height. The die 230 is rectangular in shape, having equally spaced straightening upper die plates 258 extending vertically downward from the lower end thereof. The upper die plates 258 are each formed with an inverted V-shaped slot generally designated 262, in its lower face, the slot 262 having a smooth converging sides 264 and a flattened horizontal apex 266. Between each pair of upper die plates is a recess 260 with an upwardly formed V-shaped base 268 having a horizontal flattened apex (not shown) in the same plane as the flattened apexes of the adjoining V-shaped slots 264 to form a continuous horizontal surface.

The lower die 252 has a series of upwardly extending lower parallel die plates 270 separated by recessers 278. The end recess beyond the last die plate 270 has a strengthening rib 280 extending from the longitudinal end of the die 252 to the apex of a V-shaped slot, generally designated 272, in the adjacent plate 270. Each lower die plate 270 is directly beneath the recess 260 of the upper die 230 while each recess 278 in the lower die 252 is directly beneath a die plate 258 extending downwardly from the upper die 230. The upper face of each lower die plate 270 has a V-shaped camming slot 272 with smooth diverging sides 274 capable of being in face to face contact with the V-shaped base 268 of the above recess 260 except that the flattened apex 266 of the upper recess 260, leaves a small triangular shaped open area. Each included recess 268, between the pairs of lower die plates 270, has an inverted V-shaped base comprising; a pair of smooth converging sides 276, and a cut out V-shaped apex 282 in line with the apexes of the adjacent lower die plate slots 272 and forming a miniature V-shaped slot extending the length of the lower die 252. The slot 262 in each upper die plate 258 is capable of face to face contact with the base of the respective recess 278 in the lower die 252 except for the flattened apex 266 of the slot 262 and the V-shaped apex 282 of the recess 278 which together define a triangular opening. The triangular openings defined by; the upper die plates 258—lower recesses 278, and the lower die plates 270—upper recesses 260; form a continuous triangular passage extending the length of the dies 230 and 252. When the die blocks 186 and 236 are in the relaxed, extended position (FIGS. 6 and 8) the ends of the upper and lower plates 258 and 270 of all the dies (228, 230, 250, 252) overlap to form pentagonal passages completely surrounding the insertion tubes 224. When the insertion tubes have been withdrawn and the die blocks 186 and 236 have been compressed together, the included transistor leads 112 are each held between the pairs of die plates 258 and 270 abutting the flattened apexes 266 of the upper plates 258 and the V-shaped cut out apexes 282 of the lower plates 270 with the upper and lower dies 230 and 252 slightly apart.

In operation, the feed bolt 65, reciprocatable in the inserter 60, first receives a transistor T in the nest 61 at the forward end thereof. As shown in FIG. 1, the transistor is clamped into the nest 61, by an overlapping finger 63, with the bent and/or twisted leads 112 of the transistor T extending toward the die housing 18, and the combing arms 86 and 87 pivoted away from the leads in their rest positions. The hammer motor 28 has not yet been activated so that the cams $C_1$, $C_2$, 46 and 62 are held in the shown position.

Figure 7:
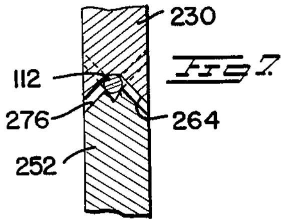
FIG. 7 is a partial view of the same pair of opposing dies with the insertion tube retracted and the dies positioned so as to straighten a lead of a transistor.
Figures 8, 9:
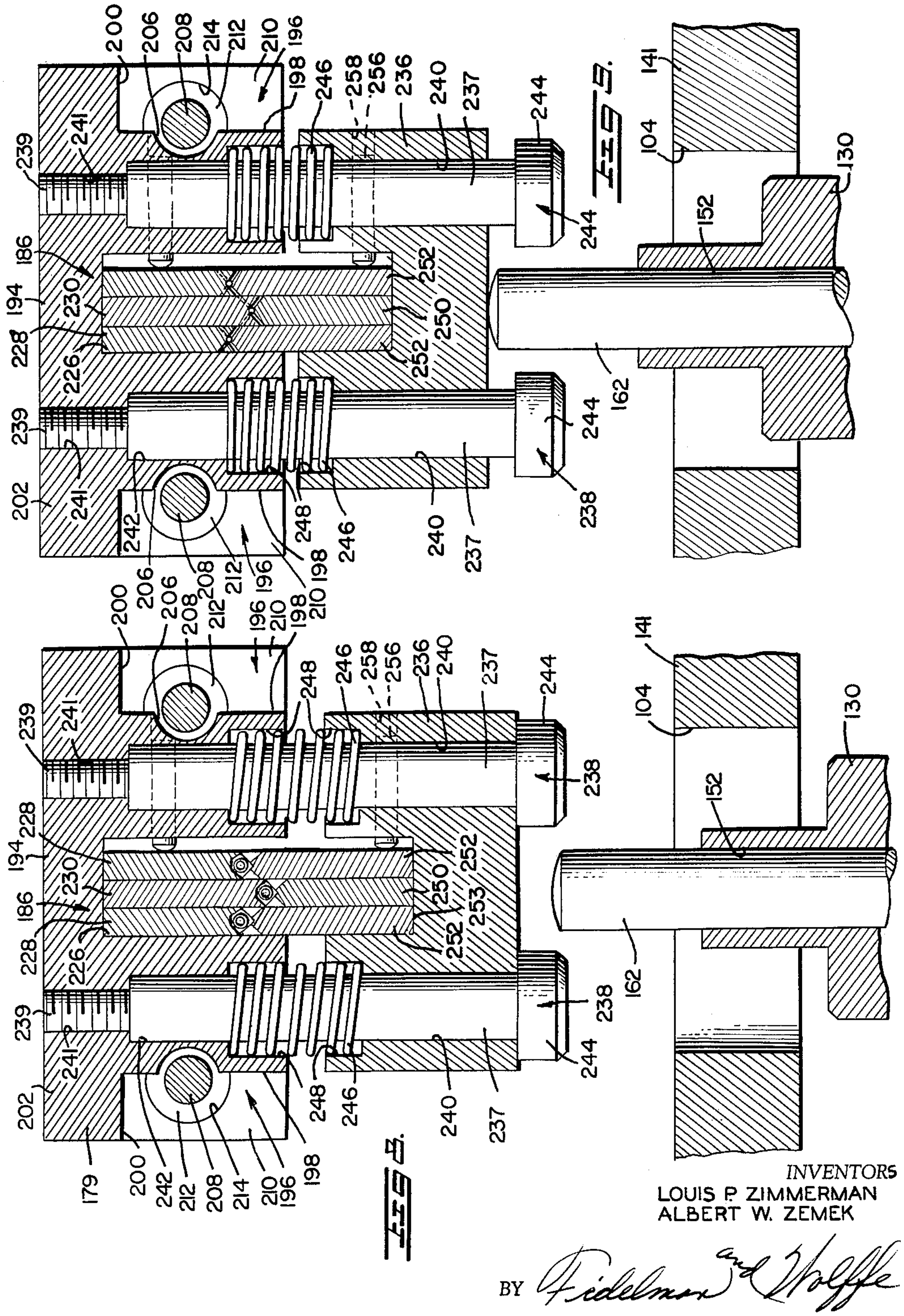
FIG. 8 is a cross-sectional elevation view of the hammer and die mechanism of the instant invention with the insertion tubes extending between the dies, taken along lines 8—8 of FIG. 4.
FIG. 9 is a cross-sectional elevation view of the hammer and die mechanism of the instant invention during the hammering stroke with the insertion tubes retracted from between medias, taken along lines 9—9 of FIG. 12.
Figure 10:
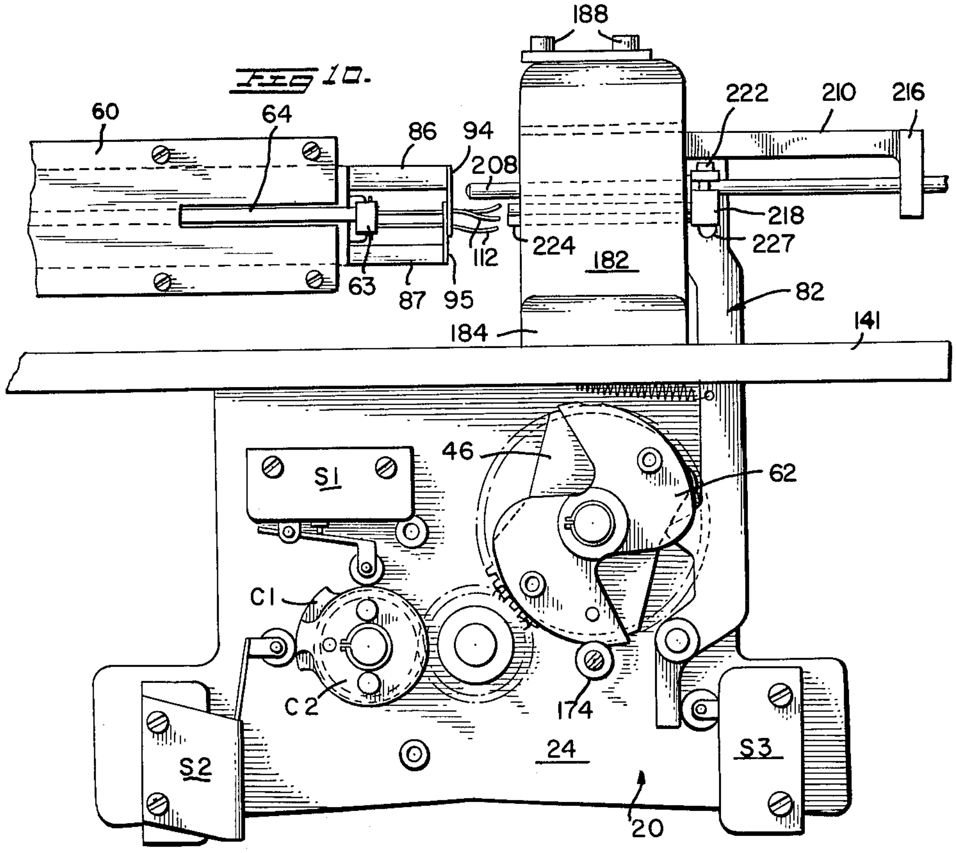
FIG. 10 is a side elevation view of the transistor hammering mechanism and a portion of the inserting and combing device with portions of the hammer mechanism removed for clarity, illustrating the positions of elements of the hammer mechanism during the combing operation.
Figure 11:
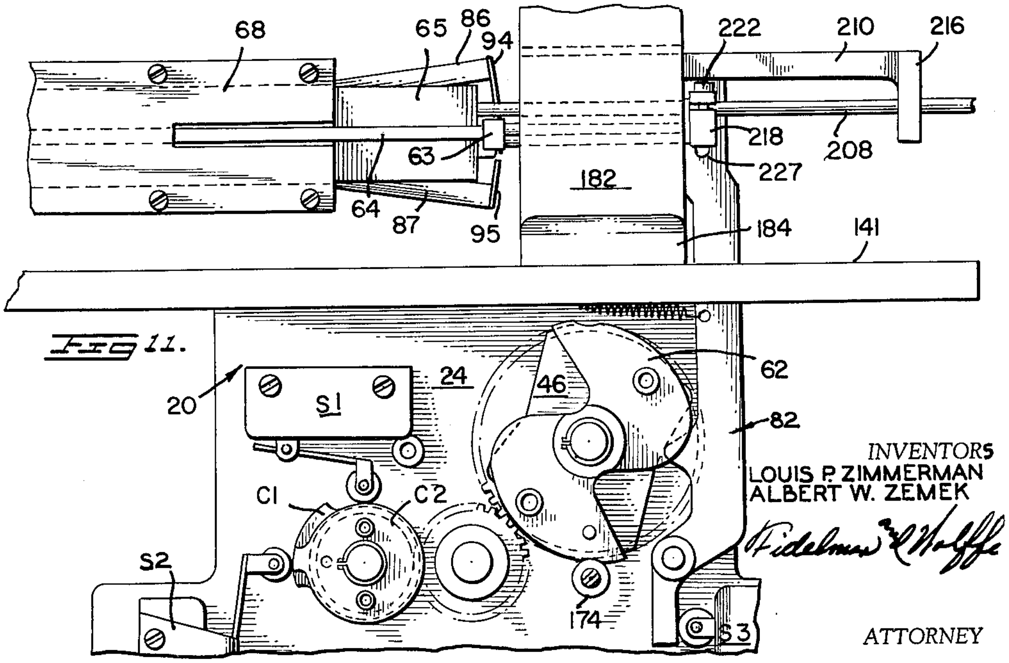
FIG. 11 is a side elevation view of the transistor hammering mechanism and a portion of the inserting and combing device, with portions of the hammer mechanism removed for clarity, illustrating the positions of elements of the hammer mechanism during the insertion of the leads of a transistor into the hammering dies.

As shown in FIG. 10, the feed bolt 65 has started to move out of the inserter 60 toward the insertion tubes 224 extending completely through the die housing 18. The comb arms 86 and 87 have pivoted inwardly to grip the leads 112 between the overlapping combs 94 and 95. The comb arms 86 and 87 advance toward the die housing 18 at a faster rate than the inserter bolt 65, combing the leads as they advance. The hammer motor 28 is still not activated and the cams $C_1$, $C_2$, 46 and 62 remain motionless. When the combs 95 and 94 reach the ends of the leads 112, the insertion bolt 65 has extended the transistor T to a point with the leads 112 adjacent the insertion tubes 224. The leads 112 each move into a passage 221 of an insertion tube 224, guided by the bevel 223 in the rear end thereof. As the leads 112 are driven down the lengths of the passages 221 of the insertion tubes 224, the comb arms 86, 87 pivot apart to allow the outer face of the finger 63, resting on the face of the transistor body T, to abut the beveled ends of the insertion tubes 224 as illustrated in FIG. 11. The central axes of the leads 112 of the transistor T are not concentric with the tubes 224 but are adjacent the upper ends of the insertion tubes 224 (FIG. 13) so that the ends of the leads 112 adjacent the transistor body T will not be formed when the tubes 224 are withdrawn and the lower dies 250 and 252 hammer the leads 112 against the upper dies 228 and 230 respectively (FIGS. 7 and 9).

Figure 12:
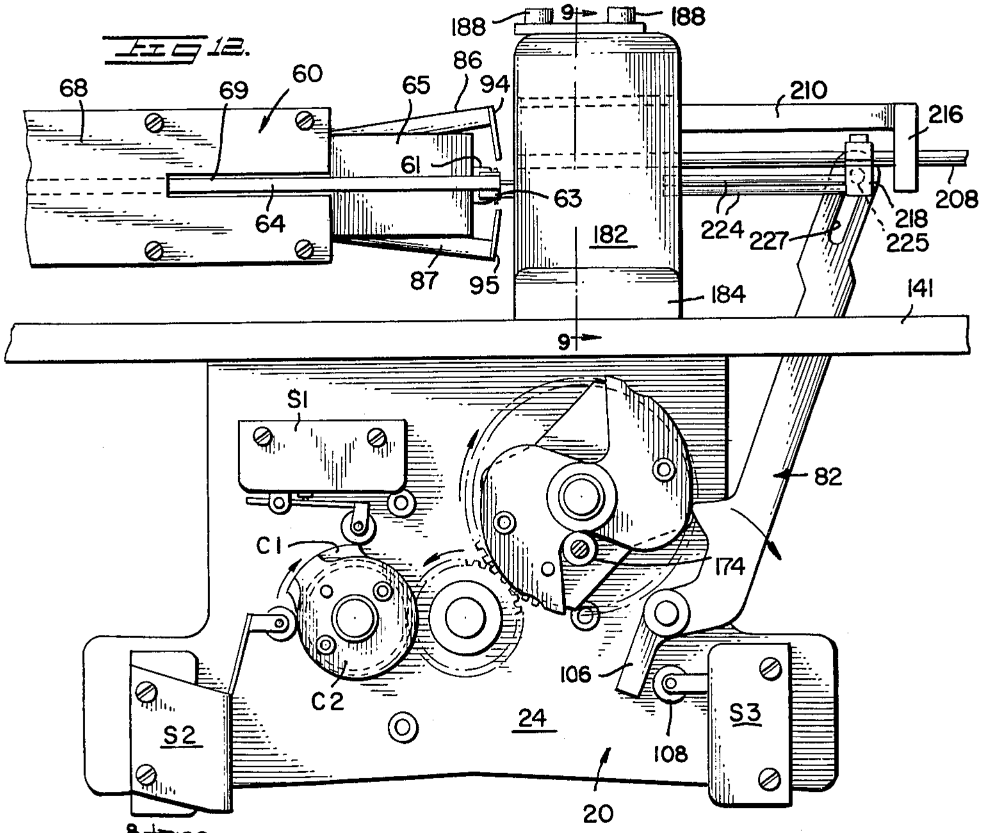
FIG. 12 is a side elevation view of the transistor hammering mechanism and a portion of the inserting and combing device, with portions of the hammer mechanisms removed for clarity, illustrating the positions of elements of the hammer mechanism during the hammering stroke.

When, as shown in FIG. 12, the inserter progresses past the point in which the leads 112 of the transistor T are fully inserted into the insertion tubes 224, the hammer motor is started (in a manner to be explained later). The second composite driven member 54, carrying the hammer cam 62 and the tube withdrawal cam 46 begins to rotate pivoting the lever 82 clockwise. The pin and slot connection 225, 227, between the upper end of the lever 82 and the tie block 218 causes the tie block 218 to be driven linearly away from the die housing, reciprocating the guide rods 208 and withdrawing the insertion tubes from between the upper dies 228, 230 and the lower dies 250 and 252. If the guide tube withdrawing cam 46 does not start pivoting the lever 82 for retracting the insertion tubes as soon as the transistor and T abuts them, the end of the feed belt 65 pushes against the guide tubes 208, retracting the insertion tubes 224 to a point where they are no longer extending out of the near end of the die housing 18. It is not necessary that both guide tubes 208 abut the bolt 65, it being possible to have only one guide tube extend beyond the die housing. When the lever 82 has reached its fully pivoted clockwise position (as shown in FIG. 12), with the insertion tubes 224 retracted, the lower end 106 of the lever 82 releases the pressure on the roller 108 of the switch $S_3$, permitting the outwardly biased safety switch $S_3$ to move to a secondary position. The pin 174, which has held the hammer 162 in its cocked position by compressing the coil spring 154, drops off of the ramp of the cam 62, as this cam rotates, and moves upwardly under the pressure of the spring toward the lower end of the next cam ramp. The released hammer 162 moves rapidly upward from its cocked position (FIG. 8) to its released position (FIG. 9) to hammer the die blocks 186 and 236 together, and straighten the leads 112 held between the included dies. The cam follower pin 174 then moves downwardly under the direction of the second ramp of the rotated cam 62 until the hammer is again fully cocked. As the hammer 162 is in the process of being cocked, the lever 82 is pivoted counterclockwise to linearly drive the tie block 218 along with the guide tubes 208 inward toward the die housing 18, restoring the insertion tubes 224 to a position in which they extend through the die housing 18. Before the insertion tubes 224 can again contact the leads 112 of the transistor T, the feed bolt retracts, removing the leads 112 from between the die blocks 186 and 236. The hammer motor 28 stops as the cam follower pin 174 approaches the second drop off adjacent the end of the second ramp on the cam 62, the cams 46 and 62 having rotated 180° during the entire operation. The first composite driven member 43 with the included cams $C_1$ and $C_2$ rotates 360° during each actuation of the hammer motor 28 due to a 2:1 ratio between the gears 42 and 44.

Figure 14:
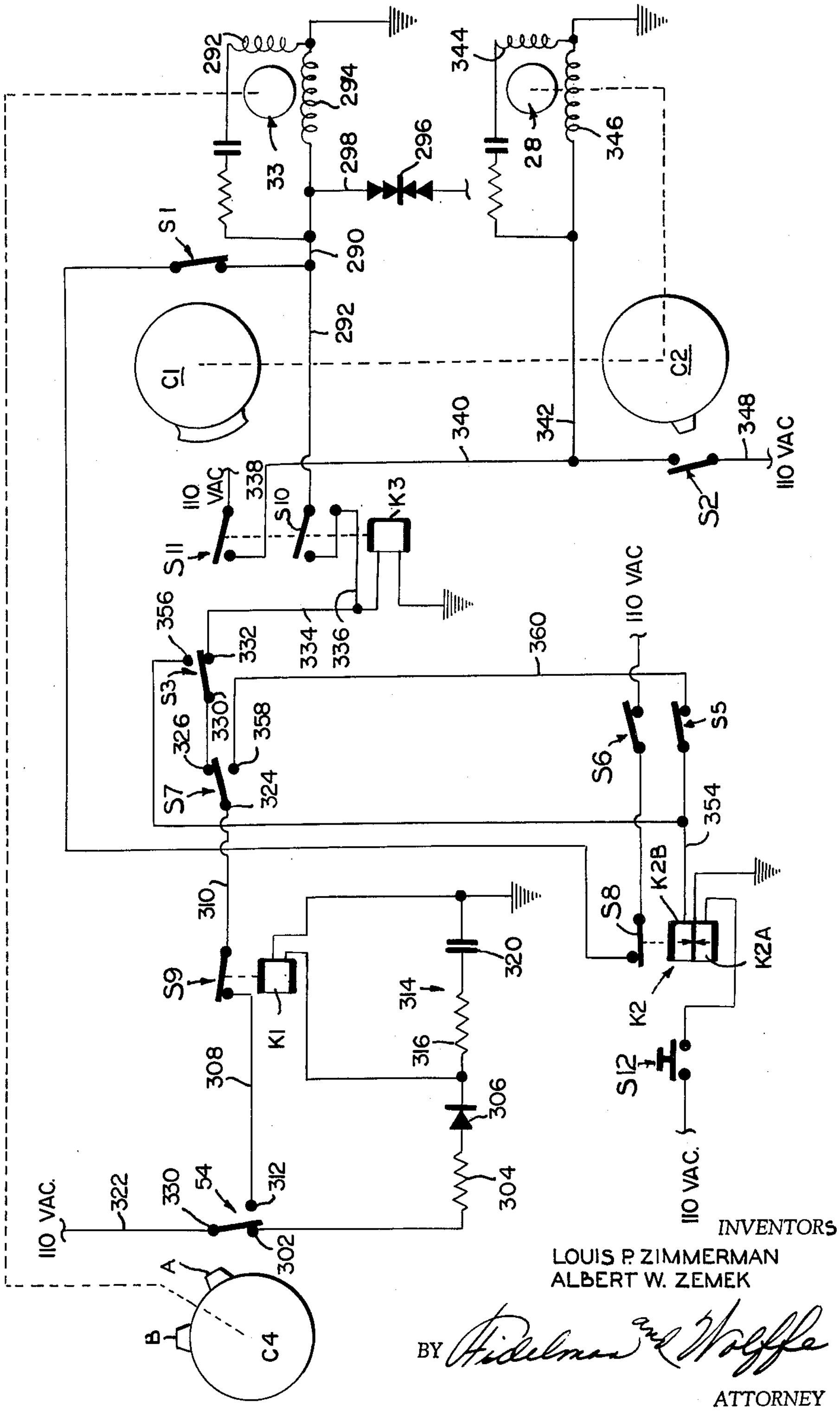

Referring particularly to FIG. 14, the entire machine is started by closing an "on-off" switch $S_6$ to provide electrical power to an inserter motor 33 through a power line 284 upon the momentary depression of a "start" button $S_{12}$ which actuates a coil $K_{2a}$ of a solenoid $K_2$ to close a start switch $S_8$ and complete the circuit from power line 284 to a line 286, through a switch $S_1$ (which is closed in the rest position as shown) to a line 288 and a line 290 and through the parallel windings 292 and 294 of the two phase inserter induction motor 33 to ground. A four-barrier layer device 296 connected in parallel between winding 294 of the inserter motor 33 and line 290, by power line 298, impresses a braking current on the inserter motor 23 through winding 294 upon the back of the inserter motor when the current from the line 290 is shut off. When the inserter motor 33 is started the lobes of the driven cam $C_4$ do not contact switch $S_4$ and the switch blade is connected across contacts 300 and 302 to complete a circuit through a current limiting resistor 304 and rectifying diode 306, across the solenoid $K_1$ to ground to hold the switch $S_9$ in the closed position, bridging the lines 308 and 310. As the inserter motor 33 rotates, a dwell A on a cam $C_4$, mounted on the shaft of the inserter 33, biases the switch $S_4$ to a position across a pair of contacts 300 and 312 breaking the electrical connection between contact 300 and 302. A sustaining circuit 314 comprising a resistor 316 and a capacitor 320, in parallel with the solenoid $K_1$, has been charged by a direct current from the diode rectifier 615, keeping the solenoid $K_1$ activated for a brief time after the circuit has been broken by the opening of switch $S_4$ by cam $C_4$, and holding the switch $S_9$ in the bridging position. A momentary circuit from a power source line 322 is completed across switch $S_4$, line 308, switch $S_9$, line 310, switch $S_7$ (contacts 324, 326), line 328, switch $S_3$ (contacts 330, 332) to line 334 and through a solenoid $K_3$ to ground, to activate the solenoid $K_3$ and close switches $S_{10}$ and $S_{11}$. During this momentary closing of switch $S_{10}$, a circuit is completed from line 288, line 292, through $S_{10}$ and line 336 and through solenoid $K_3$ to ground to sustain the activation of solenoid $K_3$, holding the switches $S_{10}$ and $S_{11}$ closed after the dwell A on cam $C_4$ allows the switch $S_4$ to open between contacts 300 and 312 and move back to the rest position between contacts 300 and 302. The closing of switch $S_{11}$ completes a circuit from a power line 338, lines 340 and 342 and through parallel windings 344 and 346 of the two phase hammer induction motor 28 to ground, rotating the motor 28 to withdraw the insertion tubes 224 and thereafter release the cocked hammer 162. The cam $C_2$, rotating with the hammer motor 28, holds the switch $S_2$ biased open when the hammer motor is stopped. When the hammer motor 28 starts to rotate, cam $C_2$ also rotates, releasing switch $S_2$ and completing a circuit from a power source line 348, switch $S_2$ and lines 350 and 342 through the windings 346 and 344 of the hammer motor 28 to ground. The cam $C_1$, also rotated by the hammer motor 28, opens the switch $S_1$ as the hammer motor rotates, breaking the circuit to the inserter motor 33 and stopping the motor 33 quickly with the help of the braking circuit 296 while the inserter arm is in its extreme forward position with the leads of the carried transistor inserted between the die blocks with the insertion tubes withdrawn. The opening of switch $S_1$ also stops the current to solenoid $K_3$ from line 336. Since the dwells A or B on cam $C_4$ are not timed to close switch $S_4$ across contacts 300 and 312 at this time, no current reaches the solenoid $K_3$ from line 334 either, and the solenoid $K_3$ is deactivated, the switches $S_{10}$ and $S_{11}$ open. The opening of switch $S_{11}$ leaves the control of the hammer motor 28 to cam $C_2$ which at this time is not biasing the switch $S_2$ and a circuit continues complete from the power source line 348 through switch $S_2$, line 350 and line 342 to the hammer motor 28. As the hammer motor 28 continues to rotate the dwell on cam $C_1$ moves away from switch $S_1$ which closes, restarting the inserter motor while cam $C_2$ rotates into position to break switch $S_2$ and stop the hammer motor 28 with the insertion tubes extending between the dies and the hammer recocked.

While the inserter bolt 65 is being moved into its position with the leads of a transistor to be driven into the die blocks 186, 236. The insertion tubes 224 should be extending through and between the die blocks 186 and 234. If the insertion tubes 224 are not inserted between the blocks, then the switch $S_3$ regulated by the lever end 106 of the lever 82 is released by the lever 82 in a position with its contacts 330 and 356 carrying the current through a line 354 and to ground through a solenoid $K_{26}$, activating said solenoid and opening switch $S_8$ to stop the inserter motor.

The insertion tubes 224 are in place within the die blocks 186 and 236 as required for proper operation, the dwell B on the cam $C_4$ closes switch $S_4$, while the switch $S_9$ is momentarily held closed, to complete a circuit from the power source line 322 switch $S_4$, line 308, switch $S_9$, line 310, switch $S_7$, line 328, switch $S_3$, and line 334 through solenoid $K_3$ to ground. Since the inserter motor 33 is still activated at this time through switch $S_1$, the dwell B does not effect the action of the inserter motor 33 at the hammer motor 28 in this position.

At the end of the cycle the leads 1 and 2 of the transistor have been straightened and the feed bolt 65 is in its most rearward position momentarily closing the switch $S_7$ to bridge contacts 324 and 358 while the dwell A on cam $C_4$ closes switch $S_4$, if the switch $S_5$ is closed to provide for single cycle operation the circuit is completed through line 360 and solenoid $K_{26}$ to ground. The activation of the solenoid $K_{2b}$ acts, as discussed before, to open switch $S_8$ and cut off both the inserter motor 33 and the hammer motor 28. If the switch $S_5$ is left open no circuit is formed when the switch $S_7$ is momentarily actuated, the switch $S_8$ remains closed, and another cycle starts automatically.

It will be obvious to those skilled in the art that various changes may be made without departing from the spirit of the invention and therefore the invention is not limited to what is shown in the drawings and described in the specification but only as indicated in the appended claims.

What is claimed is:

1. An apparatus for straightening the leads of a component having at least two parallel leads extending from a side thereof comprising; a means for holding and inserting the component leads between at least one pair of lead straightening interlocking dies, each of said pair of dies having at least one passage for receiving an individual lead for straightening, and removable component lead guide means positioned within each said passage during insertion of said leads.

2. An apparatus according to claim 1 in which said guide means comprises retractable hollow tubes extending one through each of said passages.

3. An apparatus according to claim 2 in which one die of each of said pairs of interlocking dies is stationary, the holding and inserting means inserting each of said component leads into an end of a different one of said hollow guide tubes, in a direction parallel to the axis of said tube, said holding and inserting means holding said component during the insertion of the leads into the tube with the axes of the leads thereof offset from the axes of the respective tubes in the direction of said stationary die.

4. An apparatus according to claim 3 in which the end of each hollow guide tube, adjacent the component, is inwardly circumferentially beveled from the periphery to the hollow interior to form a camming surface for directing the lead into the tube.

5. An apparatus according to claim 2 wherein said interlocking dies are yieldably held apart, and there is provided a hammer, a first cam means driven by a hammer motor, and means operatively connecting said hammer and said first cam means to cause said hammer to strike one of the dies of each of said interlocking die pairs to move the dies of each said pairs closer together to straighten said leads.

6. An apparatus according to claim 5 wherein a second cam means driven by said hammer motor removes said tubes from between said die pairs and actuates said hammer consecutively during the hammering operation.

7. An apparatus for straightening leads of a component having at least two parallel leads extending from one side thereof comprising; a means for holding the component and inserting each lead to be straightened into an individual passage formed between at least one pair of lead straightening interlocking dies, removable guide means within each die passage for guiding the component leads into said passage including means for preventing the insertion of the component leads upon the incorrect positioning of said guide means.

8. A control system for a machine for processing an electrical component having parallel leads comprising, in part; a first rotary electric motor for controlling a reciprocatable inserter and lead comber with means thereon for carrying the electrical component, a second rotary motor for controlling a lead hammering device, a first cam means on said first motor for operatively connecting said hammer motor to a source of power when the leads of a component carried in the inserter means are within the hammering device, a second cam means rotated by said second motor for operatively disconnecting said first motor from a source of power for a predetermined time after the component has been inserted into the hammering device, and a third cam means rotated by said second motor for operatively disconnecting the hammer motor from a source of power when the inserter motor has restarted.

9. A control system according to claim 8 wherein the hammering device comprises, in part, a die means and a retractable guide means, a safety means in conjunction with the first cam means for operatively disconnecting the first motor from a source of power if said guide means are not extending through the die means in the hammering device when the first motor has driven the reciprocatable inserter and lead comber to a position at which said leads are about to be inserted into the die means.

10. A hammering device for hammering the leads of a component comprising a die housing having at least one pair of reciprocatable interlocking dies, a series of passages through the die pairs formed by interlocking edges of said dies, a removable guide means extending through each of said passages, means for removing said guide means from said passages and means for thereafter propelling the die pair together to contract said passages and hammer the component leads.

11. A hammering device according to claim 10 in which there are at least three passages through the die pair and said guide means are hollow tubes, one tube extending through each passage to receive a component lead.

12. An apparatus according to claim 10 in which each of the dies is rectangular in shape, having flat plates extending from one side thereof at evenly spaced intervals, said pair of dies being arranged so that the plates on a first die extend toward the plates on a second die and parallel thereto, with the plates on the first die being offset between the plates of the second die.

13. An apparatus for straightening leads on a component having at least one lead extending from a side thereof comprising: a lead straightening hammer means, said hammer means including at least one pair of lead straightening dies coacting to define at least one passage for receiving an individual lead for straightening and means for moving the dies of each die pair together to contract said passage and hammer the component lead; an insertion means for holding and inserting the component lead into said hammer means; removable guide means within each said passage for guiding the component lead into said passage; and means to sequentially control operation of said guide means, said hammer means and said insertion means, whereby said guide means is positioned in said passage, said lead is guided into said passage by said guide means, said guide means is removed from said passage and said hammer means is actuated to contract said passage and hammer said lead.

References Cited by the Examiner

UNITED STATES PATENTS

| | | | |
|---|---|---|---|
| 3,028,886 | 4/1962 | Drukker | 140—147 |
| 3,079,958 | 3/1963 | Helda | 140—147 |
| 3,106,945 | 10/1963 | Wright et al. | 140—147 |

RICHARD J. HERBST, *Primary Examiner.*